United States Patent
Bleeker et al.

(10) Patent No.: US 7,239,393 B2
(45) Date of Patent: Jul. 3, 2007

(54) CALIBRATION METHOD FOR A LITHOGRAPHIC APPARATUS AND DEVICE MANUFACTURING METHOD

(75) Inventors: Arno Jan Bleeker, Westerhoven (NL); Henricus Wilhelmus Maria Van Buel, Eindhoven (NL); Joeri Lof, Eindhoven (NL)

(73) Assignee: ASML Netherlands B.V. (NL)

( * ) Notice: Subject to any disclaimer, the term of this patent is extended or adjusted under 35 U.S.C. 154(b) by 467 days.

(21) Appl. No.: 10/871,699

(22) Filed: Jun. 21, 2004

(65) Prior Publication Data

US 2005/0024643 A1 Feb. 3, 2005

(30) Foreign Application Priority Data

Jun. 26, 2003 (EP) .................................. 03254058

(51) Int. Cl.
*G01B 11/00* (2006.01)

(52) U.S. Cl. ..................................... 356/400

(58) Field of Classification Search ......... 356/399–400
See application file for complete search history.

(56) References Cited

U.S. PATENT DOCUMENTS

| | | | | |
|---|---|---|---|---|
| 4,464,030 A * | 8/1984 | Gale et al. .................. | 396/548 |
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,687,041 B1 | 2/2004 | Sandstrom | |
| 6,747,783 B1 | 6/2004 | Sandstrom | |
| 6,795,169 B2 | 9/2004 | Tanaka et al. | |

(Continued)

FOREIGN PATENT DOCUMENTS

EP 0 613 051 8/1994

(Continued)

OTHER PUBLICATIONS

European Search Report for European Appln. 03254058.5 mailed Aug. 17, 2004.

*Primary Examiner*—Gregory J. Toatley, Jr.
*Assistant Examiner*—Isiaka O. Akanbi
(74) *Attorney, Agent, or Firm*—Sterne, Kessler, Goldstein & Fox P.L.L.C.

(57) ABSTRACT

A calibration method comprising generating a pattern with an array of individually controllable elements, providing a substrate table with a radiation sensor, using radiation to generate an image of the pattern at the substrate table, moving at least one of the generated pattern and the substrate table relative to each other in order to move the image relative to the sensor, detecting radiation intensity with the sensor, and calculating a calibration establishing a relationship between coordinates of the coordinate system of the array of individually controllable elements and coordinates of the coordinate system of the substrate table, based on the detected intensity and the positions of the array of individually controllable elements and the substrate table.

19 Claims, 1 Drawing Sheet

U.S. PATENT DOCUMENTS

| | | |
|---|---|---|
| 6,806,897 B2 | 10/2004 | Kataoka et al. |
| 6,811,953 B2 | 11/2004 | Hatada et al. |
| 7,016,016 B2 * | 3/2006 | Munnig Schmidt et al. .. 355/53 |
| 7,095,484 B1 * | 8/2006 | Fries ........................... 355/67 |
| 2003/0026501 A1 | 2/2003 | Mei et al. |
| 2004/0041104 A1 * | 3/2004 | Liebregts et al. ...... 250/492.22 |
| 2004/0075882 A1 * | 4/2004 | Meisburger ................. 359/290 |
| 2004/0130561 A1 | 7/2004 | Jain |
| 2005/0007572 A1 | 1/2005 | George et al. |

FOREIGN PATENT DOCUMENTS

| | | |
|---|---|---|
| EP | 1 107 064 | 6/2001 |
| EP | 1 267 212 | 12/2002 |
| WO | WO 98/33096 | 7/1998 |
| WO | WO 98/38597 | 9/1998 |
| WO | WO99/45435 | 9/1999 |

* cited by examiner

CALIBRATION METHOD FOR A LITHOGRAPHIC APPARATUS AND DEVICE MANUFACTURING METHOD

BACKGROUND OF THE INVENTION

1. Field of the Invention

The present invention relates to a calibration method for a lithographic apparatus and to a device manufacturing method.

2. Related Art

A lithographic apparatus is a machine that applies a desired pattern onto a target portion of a substrate. Lithographic apparatus can be used, for example, in the manufacture of integrated circuits (ICs), flat panel displays and other devices involving fine structures. In a conventional lithographic apparatus, a patterning means, which is alternatively referred to as a mask or a reticle, may be used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation-sensitive material (resist). Instead of a mask, the patterning means may comprise an array of individually controllable elements that generate the circuit pattern on an impinging light beam.

In general, a single substrate will contain a network of adjacent target portions that are successively exposed. Lithographic apparatus include steppers, in which each target portion is irradiated by exposing an entire pattern onto the target portion in one pass, and scanners, in which each target portion is irradiated by scanning the pattern through the projection beam in a given direction (the "scanning"-direction), while synchronously scanning the substrate parallel or anti-parallel to this direction.

In a lithographic apparatus, a substrate table will generally be movable and its position within a coordinate system can be known and controlled with very great accuracy. For example, this can be done using interferometric measuring means. Similarly, if an array of individually controllable elements is movable, then its position within a coordinate system, possibly a different coordinate system, will also be measurable very accurately. The coordinate of any addressable pixel within the array of individually controllable elements will be very accurately defined. However, although arrays of individually controllable elements are used in lithographic projection apparatus, there are not known calibration methods for determining the relationship between the coordinate system of the array of individually controllable elements and the coordinate system of the substrate table. This calibration is desired to image a feature at a specific location on a substrate on the substrate table so that it is known where to generate that feature on the array of individually controllable elements.

Without properly defined calibration methods there exists further problems, such as the calibration might take an excessively long length of time, for example, because certain arrays of individually controllable elements consist of tens of millions of movable mirrors which would have to be calibrated. If the calibration is not properly performed, there is the problem that defective patterns will result. A further problem regarding calibration is that in some lithographic projection apparatus the wafer table and/or array of individually controllable elements are scanned, such that they are in motion during the exposure of the pattern and the radiation system may be pulsed. This means that, as well as spatial calibration, it is also necessary to calibrate the timing of the radiation pulses with respect to the velocities of the movable components, because there can be a delay between a trigger signal for the pulse of radiation and the actual emission of the radiation pulse.

It is an object of the present invention to provide a calibration method for determining a relationship between a coordinate system of an array of individually controllable elements and a coordinate system of a substrate table.

SUMMARY OF THE INVENTION

One embodiment of the present invention provides a calibration method, for use with a lithographic projection apparatus, comprising the steps of providing an illumination system for supplying a projection beam of radiation; providing an array of individually controllable elements serving to impart the projection beam with a pattern in its cross-section, providing a substrate table for supporting a substrate, and providing a projection system for projecting the patterned beam onto a target portion of the substrate. The method further comprises the steps of generating a pattern with the array of individually controllable elements, providing the substrate table with a radiation sensor, shining radiation to generate an image of the pattern at the substrate table, moving at least one of the generated pattern and the substrate table relative to each other in order to move the image relative to the sensor, detecting radiation intensity with the sensor, and calculating a calibration establishing a relationship between coordinates of the coordinate system of the array of individually controllable elements and coordinates of the coordinate system of the substrate table, based on the detected intensity and the positions of the array of individually controllable elements and the substrate table.

Another embodiment of the present invention provides a device manufacturing method comprising the steps of providing a substrate, providing a projection beam of radiation using an illumination system, using an array of individually controllable elements to impart the projection beam with a pattern in its cross-section, and projecting the patterned beam of radiation onto a target portion of the substrate, performing a calibration method as defined above to obtain calibration information, and positioning the substrate and the array of individually controllable elements with respect to each other using the calibration information.

According to a yet further embodiment of the present invention there is provided a computer program for controlling a lithographic apparatus, comprising code means for performing a calibration method.

Further embodiments, features, and advantages of the present invention, as well as the structure and operation of the various embodiments of the present invention are described in detail below with reference to accompanying drawings.

BRIEF DESCRIPTION OF THE FIGURES

The accompanying drawings, which are incorporated herein and form a part of the specification, illustrate various embodiments of the present invention and, together with the description, further serve to explain the principles of the invention and to enable a person skilled in the pertinent art to make and use the invention.

In the Figures, corresponding reference symbols indicate corresponding parts.

DETAILED DESCRIPTION OF THE DETAILED EMBODIMENT(S)

Terminology

Figure 1:
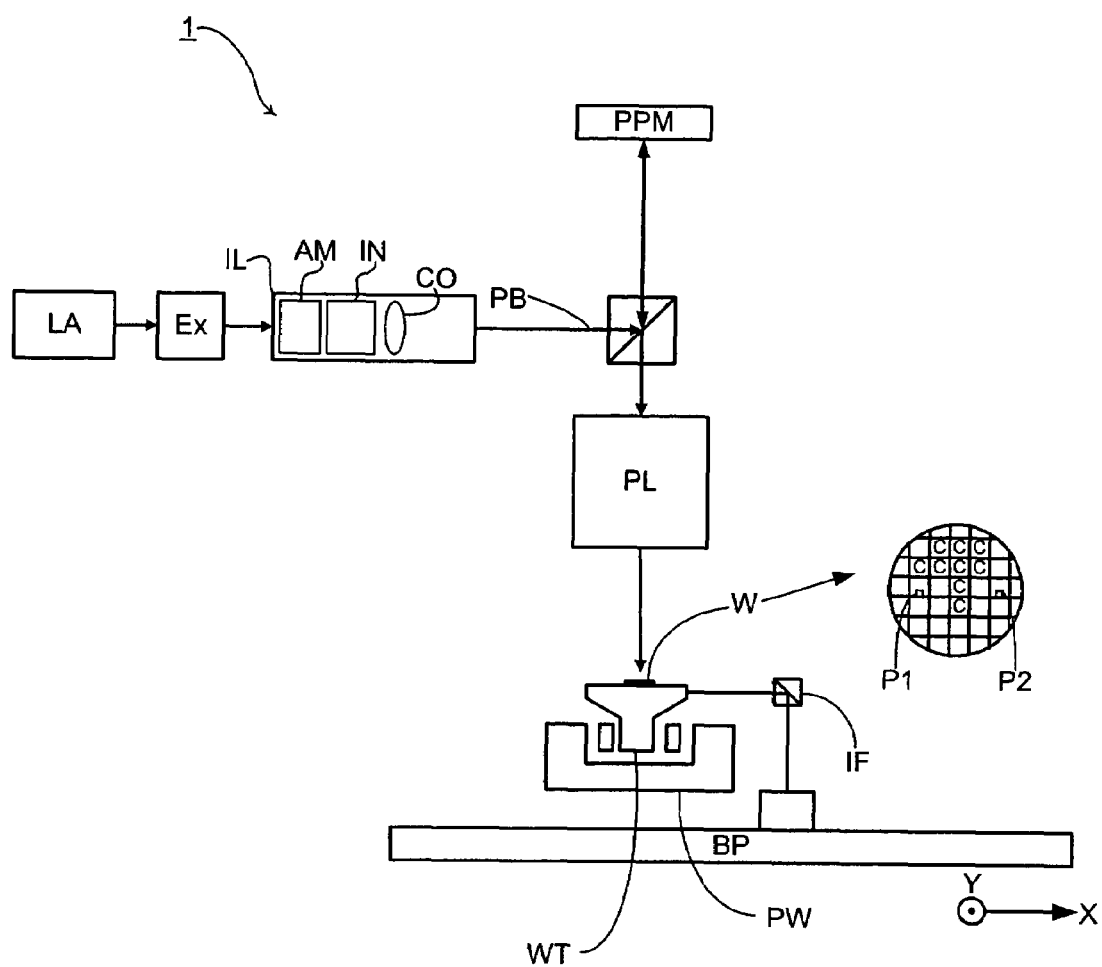
FIG. 1 depicts a lithographic apparatus, according to one embodiment of the invention.

The term "array of individually controllable elements" as here employed should be broadly interpreted as referring to any means that can be used to endow an incoming radiation beam with a patterned cross-section, so that a desired pattern can be created in a target portion of the substrate; the terms "light valve" and "Spatial Light Modulator" (SLM) can also be used in this context. Examples of such patterning means include, but are not limited to, a programmable mirror array and a programmable liquid crystal device (LCD) array.

A programmable mirror array may comprise a matrix-addressable surface having a viscoelastic control layer and a reflective surface. The basic principle behind such an apparatus is that addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter may filter out the diffracted light, leaving the undiffracted light to reach the substrate.

An array of diffractive optical MEMS devices can also be used in a corresponding manner. Each diffractive optical MEMS device is comprised of a plurality of reflective ribbons that can be deformed relative to one another to form a grating that reflects incident light as diffracted light.

A further alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors.

The matrix addressing can be performed using suitable electronic means. In the examples described above, the array of individually controllable elements can comprise one or more programmable mirror arrays. More information on mirror arrays can be found, for example, from U.S. Pat. Nos. 5,296,891 and 5,523,193, and PCT patent applications WO 98/38597 and WO 98/33096, which are incorporated herein by reference.

An example programmable LCD array is shown in U.S. Pat. No. 5,229,872, which is incorporated herein by reference.

It should be appreciated that where pre-biasing of features, optical proximity correction features, phase variation techniques, and multiple exposure techniques are used, for example, the pattern "displayed" on the array of individually controllable elements may differ substantially from the pattern eventually transferred to a layer of or on the substrate. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures, during which the pattern on the array of individually controllable elements and/or the relative position of the substrate changes.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat panel displays, thin-film magnetic heads, etc. The skilled artisan will appreciate that, in the context of such alternative applications, any use of the terms "wafer" or "die" herein may be considered as synonymous with the more general terms "substrate" or "target portion," respectively.

The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including, but not necessarily limited to, ultraviolet (UV) radiation (e.g. having a wavelength of 408, 355, 365, 248, 193, 157 or 126 nm) and extreme ultra-violet (EUV) radiation (e.g. having a wavelength in the range of 5-20 nm), as well as particle beams, such as ion beams or electron beams.

The term "projection system" used herein should be broadly interpreted as encompassing various types of projection systems, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables. In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the array of individually controllable elements and the first element of the projection system. Immersion techniques are well known in the art for increasing the numerical aperture of projection systems.

Exemplary Environment

FIG. 1 schematically depicts a lithographic projection apparatus, according to one embodiment of the invention.

The apparatus comprises an illumination system (illuminator) IL, an array of individually controllable elements PPM, a substrate table WT for supporting a substrate W, and a projection system ("lens") PL.

Illumination system (illuminator) IL provides a projection beam PB of radiation (e.g. UV radiation).

The array of individually controllable elements PPM (e.g., a programmable mirror array) patterns the projection beam. In one example, the position of the array of individually controllable elements will be fixed relative to projection system PL. In another example, it may instead be connected to a positioning means for accurately positioning it with respect to projection system PL.

As discussed above, the substrate table WT (e.g., a wafer table) supports the substrate W (e.g. a resist-coated wafer). The substrate table WT is also connected to a positioning means PW for accurately positioning the substrate with respect to projection system PL.

The projection system ("lens") PL images a pattern imparted to the projection beam PB by the array of individually controllable elements PPM onto a target portion C (e.g., comprising one or more dies) of the substrate W. In one example, the projection system PL may image the array of individually controllable elements PPM onto the substrate W. In anther example, the projection system PL may image secondary sources, for which the elements of the array of individually controllable elements PPM act as shutters. The projection system PL may also comprise an array of focusing elements, such as a micro lens array (known as an MLA) or a Fresnel lens array. This can be done, for example, to form the secondary sources and to image microspots onto the substrate.

In the embodiment shown, the apparatus is of a reflective type (i.e., has a reflective array of individually controllable elements). However, in general, it may also be of a transmissive type, e.g., with a transmissive array of individually controllable elements.

The illuminator IL receives a beam of radiation from a radiation source SO. In one example, the source SO and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD. In this case the beam delivery system BD includes, but is not limited to, suitable directing mirrors and/or a beam expander. In other examples the source SO may be integral part of the apparatus, for example when the source is a mercury lamp. In this example, the source SO and the illuminator IL, together with the beam delivery system BD, if required, may be referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator IL can be adjusted. In some examples the illuminator IL comprises various other components, such as an integrator IN and a condenser CO. The illuminator IL provides a conditioned beam of radiation, referred to as the projection beam PB, having a desired uniformity and intensity distribution in its cross-section.

The beam PB subsequently interacts with the array of individually controllable elements PPM. Having been reflected by the array of individually controllable elements PPM, the beam PB passes through the projection system PL, which focuses the beam PB onto a target portion C of the substrate W.

In one example, with the aid of a positioning means PW, and possibly an interferometric measuring means IF, the substrate table WT can be moved accurately, e.g., so as to position different target portions C in the path of the beam PB.

In one example, a positioning means PW for the array of individually controllable elements PPM can be used to accurately correct the position of the array of individually controllable elements PPM with respect to the path of the beam PB, e.g. during a scan.

In one example, movement of the substrate table WT is realized with the aid of a long-stroke module (course positioning) and a short-stroke module (fine positioning), which are not explicitly depicted in FIG. 1. A similar system may also be used to position the array of individually controllable elements PPM.

It will be appreciated that the projection beam PB may alternatively/additionally be moveable while the substrate table WT and/or the array of individually controllable elements PPM may have a fixed position to provide the required relative movement.

As a further alternative, that may be especially applicable in the manufacture of flat panel displays, the position of the substrate table WT and the projection system PL may be fixed and the substrate W may be arranged to be moved relative to the substrate table WT. For example, the substrate table WT may be provided with a system for scanning the substrate W across it at a substantially constant velocity.

Although the lithography apparatus according to the invention is herein described as being for exposing a resist on a substrate, it will be appreciated that the invention is not limited to this use and the apparatus may be used to project a patterned projection beam for use in resistless lithography.

The depicted apparatus can be used in four one modes: a step mode, a scan mode, a pulse mode, and a continuous scan mode.

In a step mode, the array of individually controllable elements PPM imparts an entire pattern to the projection beam PB, which is projected onto a target portion C in one pass (i.e., a single static exposure). The substrate table WT is then shifted in the X and/or Y direction, so that a different target portion C can be exposed. In step mode, the maximum size of the exposure field limits the size of the target portion C imaged in a single static exposure.

In Scan mode, the array of individually controllable elements PPM is movable in a given direction (e.g., a "scan direction" or a Y direction) with a speed v, so that the projection beam PB is caused to scan over the array of individually controllable elements PPM. Concurrently, the substrate table WT is substantially simultaneously moved in the same or opposite direction at a speed V=Mv, in which M is the magnification of the lens PL. In scan mode, the maximum size of the exposure field limits the width (in the non-scanning direction) of the target portion C in a single dynamic exposure, whereas the length of the scanning motion determines the height (in the scanning direction) of the target portion C.

In Pulse mode, the array of individually controllable elements PPM is kept essentially stationary and the entire pattern is projected onto a target portion C of the substrate W using a pulsed radiation system. The substrate table WT is moved with an essentially constant speed, such that the projection beam PB is caused to scan a line across the substrate W. The pattern on the array of individually controllable elements PPM is updated as required between pulses of the radiation system. The pulses are timed such that successive target portions C are exposed at the required locations on the substrate W. Consequently, the projection beam PB scans across the substrate W to expose the complete pattern for a strip of the substrate W. The process is repeated until the complete substrate W has been exposed line by line.

Continuous scan mode is essentially the same as pulse mode except that a substantially constant radiation source is used and the pattern on the array of individually controllable elements PM is updated as the projection beam PB scans across the substrate W and exposes it.

Combinations and/or variations on the above described modes of use or entirely different modes of use may also be employed.

Exemplary Radiation Sensors

One or more embodiments of the present invention use a radiation sensor to gather information regarding a position of an aerial image of a pattern generated by array of individually controllable elements PPM, which is imaged in a vicinity of substrate table WT.

In one example, the radiation sensor is a transmission image sensor (TIS). In this example, the transmission image sensor is inset into a physical reference surface associated with substrate table WT. In one example, at least one transmission image sensor is mounted on a fiducial plate mounted to a top surface of substrate table WT, typically outside the area to be covered by wafer W. The fiducial plate is made of a highly stable material with a very low coefficient of expansion, for example Invar, and has a flat reflective upper surface, which may carry markers used with another fiducial in alignment processes.

In one example, the transmission image sensor is used to determine a position of the focal plane of the image, i.e., to determine relative positions of array of individually controllable elements PPM and substrate W in the Z direction.

Figure 2:
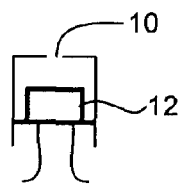
FIG. 2 is a cross-sectional schematic view of a radiation sensor according to one embodiment of the present invention.

FIG. 2 is a cross-sectional schematic view of a radiation sensor according to one embodiment of the present invention. In one example the radiation sensor is used to calibrate coordinates of array of individually controllable elements PPM and substrate table WT in the X Y plane, including displacement in the X and Y directions and rotation about the Z axis. In the embodiment shown in FIG. 2, the radiation sensor is a spot sensor comprising an aperture 10 in front of a photodiode 12, for example, which senses all of the radiation that passes through aperture 10. Typically, the dimensions of aperture 10 will be approximately the same as the smallest dimensions of features that the lithographic projection apparatus is intended to image. However, any suitable sensor with extremely small detection area could be used. A spot sensor can clearly be used to build up a picture of the image intensity distribution.

In another embodiment, a modified form of the transmission image sensor is used with the calibration method of the present invention. Array of individually controllable elements PPM, for example a micro-mirror array, is set to display a marker pattern. On substrate table WT a photo-detector is covered by a plate in which the same pattern has been formed, taking into account the magnification of projection system PL. In other words, aperture 10 of the spot detector in FIG. 2 is replaced by an aperture or a plurality of apertures corresponding to the marker pattern. When the pattern in the plate is coincident with the image of the marker pattern generated by array of individually controllable elements PPM, a large signal is detected by the photo-detector of the sensor.

In one example, photodiode 12 of the sensor could be replaced by a charge-coupled device (CCD). Integration performed electronically on all of the sensitive elements of the CCD, or the patterned plate, could be dispensed with, and identification of the image of the marker pattern on the CCD could be performed electronically.

In this embodiment, a suitable marker pattern for the calibration procedure of this invention is one or more sets of horizontal and/or vertical gratings. A pitch of the grating or gratings may be determined by the sensor used for the calibration, for example by the resolution of the sensor or by the grating pitch that can be fabricated in the plate covering the photo-detector described above.

Exemplary Calibration Methods

First Exemplary Embodiment

A calibration method according a first embodiment of the present invention comprises the following steps.

(1) A marker pattern is generated on an array of individually controllable elements PPM, which matches a pattern of a radiation sensor on substrate table WT, as is described above.

(2) Substrate table WT is moved so that the radiation sensor is positioned in a region in which an image of the marker pattern will be produced.

(3) A laser pulse is turned on and an intensity of radiation is measured at the sensor. In one example, a plurality of patterns and radiation sensors are provided and used substantially simultaneously.

(4) The marker pattern on the array of individually controllable elements PPM is moved by a specific number of pixels and/or the array of individually controllable elements PPM is moved in the X and Y directions of its coordinate system (in the case in which the array of individually controllable elements is movable).

(5) Steps 3 and 4 are repeated to gather data.

(6) Software is used to calculate an exact position of the array of individually controllable elements PPM with respect to substrate table WT using the gathered data to obtain an accurate calibration of the array of individually controllable elements PPM with respect to substrate table WT coordinate system.

In this embodiment, substrate table WT is fixed and the marker pattern is moved to find an optimal position for generating the pattern such that it falls on the radiation sensor. A coarse sweep may be performed initially to find the approximate position for the marker pattern, followed by a fine sweep, such as moving the marker pattern by an increment of only one pixel on the array of individually controllable elements PPM to locate the optimal position. The coordinates of the radiation sensor are known accurately in the coordinate system of substrate table WT.

The gathered data specifies at what position in the coordinate system of the array of individually controllable elements PPM a marker pattern must be generated such that the image falls on the radiation sensor, and therefore a calibration between the two coordinate systems is determined.

In an example where the array of individually controllable elements PPM is movable, calibration is also obtained between the coordinate system of the actuators moving the array of individually controllable elements PPM and the coordinates of the addressable pixels of the array of individually controllable elements PPM.

In one example, the distance that the marker pattern is moved at each iteration in the above method, by moving the pattern on the array of individually controllable elements PPM and/or by moving the array of individually controllable elements PPM, may be referred to as a delta step. The minimum delta step does not have to be one pixel, but can be a fraction of a pixel. In this example, a ratio of delta step/pixel size (or pixel size/delta step if the delta step is smaller than the pixel size) is not a whole number. When the ratio is close to a whole number, the positional accuracy is no more than the delta step or pixel size, but when the ratio is not a whole number, the calibration accuracy can be improved.

Second Exemplary Embodiment

In some examples of lithographic projection apparatus, a plurality of arrays of individually controllable elements PPM are provided. For example, a linear or two-dimensional the array of individually controllable elements PPM alongside the array of individually controllable elements PPM in FIG. 1. In such apparatus, either one or both of substrate table WT and the array of individually controllable elements PPM are movable, such that a pattern on each the array of individually controllable elements PPM can be imaged at substrate table WT in turn. Alternatively or additionally projection system PL may be adjustable to image each the array of individually controllable elements PPM at substrate table WT, with or without moving the array of individually controllable elements PPM or substrate table.

A method according to the second embodiment comprises the following steps.

(1) The method of embodiment 1 above is used to determine the position of one the array of individually controllable elements PPM relative to substrate table WT.

(2) The components of the apparatus are moved as necessary, such that a marker pattern on another the array of individually controllable elements PPM can be imaged at substrate table WT.

(3) The method of embodiment 1 is used to determine the position of the other the array of individually controllable elements PPM relative to substrate table WT.

(4) Steps 2 and 3 are repeated to measure the position of each the array of individually controllable elements PPM. Accordingly, an accurate calibration of all of the arrays of individually controllable elements with respect to each other and to substrate table WT coordinate system is obtained.

Third Exemplary Embodiment

A method for calibrating according to a third embodiment of the present invention comprises the following steps.

(1) The method of the first embodiment is used to determine the position of an off-center (e.g., on a right hand side of the array of individually controllable elements PPM) marker pattern generated on the array of individually controllable elements PPM.

(2) Substrate table WT is moved to a second position and that position is recorded.

(3) The method of the first embodiment is used to determine the position of a different off-center (e.g. on the left hand side of the array of individually controllable elements PPM) marker pattern generated on the array of individually controllable elements PPM.

(4) Calculations are performed based on the results of steps 1 and 3 that can yield information on both a magnification of projection system PL and calibration regarding the rotation of the array of individually controllable elements PPM with respect to substrate table WT coordinate system.

This method can also be used analogously to the second embodiment for obtaining accurate rotational calibration of a plurality of arrays of individually controllable elements with respect to each other and to substrate table WT coordinate system.

Fourth Exemplary Embodiment

In a method for calibrating according to a fourth embodiment of the present invention, the measurements of any of the above embodiments are done, but keeping the marker pattern on the array of individually controllable elements PPM stationary, and instead scanning substrate table WT (with associated radiation detector). This is in contrast to keeping substrate table WT stationary and moving the marker pattern on the array of individually controllable elements PPM. For a pulsed radiation system, the exact pulse delay timing needs to be known, but can obtained according to a method described later Fifth Exemplary Embodiment In a method for calibrating according to a fifth embodiment of the present invention, measurements are performed according to any of the proceeding embodiments. However, the marker pattern on the array of individually controllable elements PPM and substrate table WT are both scanned simultaneously, but in perpendicular directions. The method of this embodiment allows for calibration in both the X and Y directions be performed substantially simultaneously.

Sixth Exemplary Embodiment

In a method for calibrating according to a sixth embodiment of the present invention, a plurality of radiation sensors are provided on substrate table WT. For example, one radiation sensor for each the array of individually controllable elements PPM in the case where there are more than one the array of individually controllable elements PPM. This allows for the calibration to be performed more quickly.

Seventh Exemplary Embodiment

A method for calibrating according to a seventh embodiment of the present invention comprises the following steps.

(1) A method of any of the above embodiments is used to calibrate the array of individually controllable elements PPM with respect to substrate table WT coordinate system.

(2) A wafer W is provided on substrate table WT. Wafer W incorporates at least one alignment marker. An off-axis alignment system is used to calibrate a wafer coordinate system (determined by the position and orientation of the at least one alignment marker) with respect to a substrate table WT coordinate system. An accurate calibration is then obtained between the array of individually controllable elements PPM and the wafer (substrate) coordinate system.

Eight Exemplary Embodiment

In a method for calibrating according to an eighth embodiment of the present invention, steps are performed similar to the methods described above. However, instead of using the radiation system to provide a flash of laser light for each position determination, radiation of a longer wavelength is used. This radiation may be called non-actinic light if it does not cause exposure of a pattern on a resist on a substrate W. It may also be referred to as "red" light because it is of longer wavelength than the various parts of the ultraviolet spectrum that are typically used, and it may be visible red light, such as from a helium neon laser. Using longer wavelength radiation, other than the normal projection beam radiation, has the advantage that it does not need to be pulsed. Thus, timing issues, for example with respect to the fourth embodiment, are no longer a problem. It also means that the array of individually controllable elements PPM does not have to be reloaded, which is normally the case after each laser flash of actinic radiation.

Ninth Exemplary Embodiment

A method of calibrating according to a ninth embodiment of the present invention is used for calibration of laser pulse timing. The ninth embodiment comprises the following steps.

(1) A marker pattern is generated on the array of individually controllable elements PPM.

(2) Substrate table WT including a radiation sensor is scanned at constant velocity.

(3) While substrate table WT is scanning, a trigger signal is sent to produce a pulse of laser radiation, which images the marker pattern at substrate table WT.

(4) Laser timing delays and/or errors are detected as placement errors on the sensor. For example, from the coordinate position calibration known from proceeding embodiments, the position of the marker pattern with respect to the resulting position of the image of the marker pattern in substrate table WT coordinate system is known with great accuracy. A velocity of substrate table WT is also known with great accuracy. Thus, a difference between the expected position of the image of the marker pattern when the laser pulse trigger signal is generated and the resulting actual position of the image on substrate table WT enables the laser timing delay/error to be calculated by dividing the distance between these positions by the velocity of substrate table WT.

It is to be appreciated that the steps can be iterated by changing either or both of the laser pulse timing and the position of the marker pattern such that the image of the marker pattern falls on the radiation sensor.

In this embodiment, if the scanning speed of substrate table WT is essentially the same as used during exposure on a substrate, then a direct calibration between laser pulse trigger timing and image position is obtained, although separate calibration may need to be done for both scan directions to take account of different scanning speeds in different directions.

In a variation of this embodiment, in step (3), instead of firing the laser once to produce a single pulse, in practice the laser is fired multiple times.

CONCLUSION

While specific embodiments of the invention have been described above, it will be appreciated that the invention may be practiced otherwise than as described. For example, the pixels of the spatial light modulator may be programmed from behind if the substrate on which they are disposed is made of a material, e.g., silicon, which is sufficiently transparent to the programming beam, e.g., infra-red. Programming from the backside provides greater freedom to design the beam scanning unit and makes it easier to position and align the prismatic mirror. Also, by using double-sided fabrication techniques and conductors through the thickness of the substrate, the light sensitive element can be positioned on the rear surface of the substrate. This enables the light sensitive element to be made larger, allowing use of a programming beam of lower power. Also, there is greater flexibility in choosing the wavelength of the programming beam since it is no longer constrained by the transparency of the substrate. The description is not intended to limit the invention.

What is claimed is:

1. A calibration method used in a lithographic apparatus, comprising:
    (a) generating a pattern with an array of individually controllable elements;
    (b) illuminating the array of individually controllable elements with radiation to generate an image of the pattern onto a substrate table having a radiation sensor;
    (c) moving at least one of the generated pattern and the substrate table relative to each other in order to move the image relative to the radiation sensor;
    (d) detecting radiation intensity with the radiation sensor;
    (e) calculating a calibration value that establishes a relationship between coordinates of a coordinate system of the array of individually controllable elements and coordinates of a coordinate system of the substrate table, based on the detected radiation intensity and positions of the array of individually controllable elements and the substrate table; and
    (f) calibrating the array of individually controllable elements using the calibration value.

2. The method of claim 1, wherein steps (b), (c), and (d) are repeated to acquire information for step (e).

3. The method of claim 1, wherein step (c) comprises:
    scanning at least one of the generated pattern and the substrate table relative to each other, while continuously performing step (d).

4. The method of claim 1, wherein step (c) comprises one or more of:
    moving the pattern generated on the array of individually controllable elements, while keeping the substrate table stationary;
    moving the array of individually controllable elements, while keeping the substrate table stationary;
    moving the substrate table while keeping the pattern generated on the array of individually controllable elements stationary;
    moving the substrate table, while keeping the array of individually controllable elements stationary; and
    moving the substrate table and moving at least one of the array of individually controllable elements and the pattern generated on the array of individually controllable elements.

5. The method of claim 1, further comprising:
    (f) defining a distance by which the pattern is moved between successive instances of detecting the radiation intensity to be a delta step, wherein a ratio of the delta step to a pixel size of the array of individually controllable elements is not a whole number.

6. The method of claim 1, further comprising:
    (f) defining a distance by which the pattern is moved between successive instances of detecting the radiation intensity to be a delta step, wherein when the delta step is less than the pixel size, the ratio of a pixel size to the delta step is not a whole number.

7. The method of claim 1, wherein step (c) comprises:
    moving the substrate table and at least one of the array of individually controllable elements and the pattern on the array of individually controllable elements in different directions.

8. The method of claim 7, further comprising using substantially perpendicular directions as the different directions.

9. The method of claim 1, further comprising:
    performing steps (a) to (e) using a pattern generated on a first portion of the array of individually controllable elements; and repeating steps (a) to (e) using a pattern generated on a second portion of the array of individually controllable elements.

10. The method of claim 9, further comprising forming the first and second portions of the array of individually controllable elements, such that they are off-center.

11. The method of claim 9, further comprising forming the first and second portions of the array of individually controllable elements, such that they are on opposite sides of the array of individually controllable elements.

12. The method of claim 1, further comprising:
scanning the substrate table;
generating a trigger signal to trigger a pulse of radiation, which is generated by an illumination system, while the substrate table is scanning;
determining a positional error of the image of the generated pattern resulting from motion of the substrate table between generation of the trigger signal and emission of the pulse of the radiation using step (e); and
calculating radiation delay timing from the positional error.

13. The method of claim 1, wherein step (b) comprises:
using radiation with a wavelength longer than that of a projection beam of radiation provided by another illumination system.

14. The method of claim 1, further comprising:
using a plurality of the array of individually controllable elements;
performing steps (a) to (e) for each array in the plurality of arrays of individually controllable elements; and
displacing the substrate table by a known vector between the calibration for each of the arrays of the plurality of arrays of individually controllable elements.

15. The method of claim 1, further comprising:
using a plurality of the arrays of individually controllable elements;
using a plurality of the radiation sensors; and
performing steps (a) to (e) using a different respective one of the radiation sensors for each respective ones of the arrays of individually controllable elements.

16. The method of claim 1, further comprising:
using an alignment sensor to calibrate coordinates of the substrate table with respect to coordinates of a substrate provided thereon.

17. A device manufacturing method, comprising:
using an array of individually controllable elements to pattern a first beam of radiation;
projecting the patterned first beam of radiation onto a target portion of a substrate,
generating a pattern with the array of individually controllable elements;
illuminating the array of individually controllable elements with a second beam of radiation to generate an image of the pattern onto a substrate table having a radiation sensor;
moving at least one of the generated pattern and the substrate table relative to each other in order to move the image relative to the radiation sensor;
detecting radiation intensity with the radiation sensor;
calculating a calibration value establishing a relationship between coordinates of a coordinate system of the array of individually controllable elements and coordinates of a coordinate system of the substrate table, based on the detected radiation intensity and positions of the array of individually controllable elements and the substrate table; and
positioning the substrate and the array of individually controllable elements with respect to each other using the calibration information.

18. A device manufactured according to the method of claim 17.

19. A computer program product for controlling a lithographic apparatus comprising a computer useable medium having a computer program logic recorded thereon for controlling at least one processor, the computer program logic comprising:
computer program code means for generating a pattern with an array of individually controllable elements;
computer program code means for illuminating the array of individually controllable elements with radiation to generate an image of the pattern onto a substrate table having a radiation sensor;
computer program code means for moving at least one of the generated pattern and the substrate table relative to each other in order to move the image relative to the radiation sensor;
computer program code means for detecting radiation intensity with the radiation sensor;
computer program code means for calculating a calibration value establishing a relationship between coordinates of a coordinate system of the array of individually controllable elements and coordinates of a coordinate system of the substrate table, based on the detected radiation intensity and positions of the array of individually controllable elements and the substrate table; and
computer program code means for calibrating the array of individually controllable elements using the calibration value.

* * * * *